United States Patent
Lombard et al.

(10) Patent No.: US 9,679,624 B2
(45) Date of Patent: Jun. 13, 2017

(54) MAGNETIC RANDOM ACCESS MEMORY (MRAM) CELL WITH LOW POWER CONSUMPTION

(71) Applicant: CROCUS Technology SA, Grenoble (FR)

(72) Inventors: Lucien Lombard, Grenoble (FR); Ioan Lucian Prejbeanu, Seyssinet Pariset (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/647,600

(22) PCT Filed: Nov. 19, 2013

(86) PCT No.: PCT/EP2013/074194
§ 371 (c)(1),
(2) Date: May 27, 2015

(87) PCT Pub. No.: WO2014/082897
PCT Pub. Date: Jun. 5, 2014

(65) Prior Publication Data
US 2015/0302911 A1  Oct. 22, 2015

(30) Foreign Application Priority Data
Nov. 27, 2012 (EP) .................... 12290413

(51) Int. Cl.
*G11C 11/16* (2006.01)
*H01L 43/02* (2006.01)
*H01L 43/08* (2006.01)

(52) U.S. Cl.
CPC ............ *G11C 11/161* (2013.01); *G11C 11/16* (2013.01); *G11C 11/1675* (2013.01); *H01L 43/02* (2013.01); *H01L 43/08* (2013.01)

(58) Field of Classification Search
CPC ..... G11C 11/161; G11C 11/1675; G11C 11/16; H01L 43/08; H01L 43/02
See application file for complete search history.

(56) References Cited

U.S. PATENT DOCUMENTS

| 6,950,335 B2 | 9/2005 | Dieny et al. |
| 2005/0152178 A1 | 7/2005 | Katti |

(Continued)

FOREIGN PATENT DOCUMENTS

| EP | 2276034 A2 | 1/2011 | |
| EP | 2479759 A1 | 7/2012 | |
| FR | WO 2012042178 A1 * | 4/2012 | ............ G11C 11/16 |

OTHER PUBLICATIONS

International Search Report and Written Opinion for PCT/EP2013/074194 dated Mar. 10, 2014.

*Primary Examiner* — Richard Elms
*Assistant Examiner* — Jerome Leboeuf
(74) *Attorney, Agent, or Firm* — Pearne & Gordon LLP (57) ABSTRACT

A magnetic random access memory (MRAM) cell including a magnetic tunnel junction containing: a storage layer including at least one storage ferromagnetic layer, each storage ferromagnetic layer having a storage magnetization; an antiferromagnetic storage layer pinning the storage magnetization at a low threshold temperature and freeing them at a high temperature threshold; a reference layer; and a tunnel barrier layer between the reference layer and the storage layer. The magnetic tunnel junction also includes a free ferromagnetic layer having a free magnetization adapted to induce a magnetic stray field magnetically coupling the free ferromagnetic layer with the storage layer; such that the storage magnetization can be switched by the magnetic stray field when the magnetic tunnel junction is at the high temperature threshold. The disclosed MRAM cell has low power consumption.

11 Claims, 5 Drawing Sheets

(56) References Cited

U.S. PATENT DOCUMENTS

| | | | |
|---|---|---|---|
| 2005/0170218 A1* | 8/2005 | Kishi | B82Y 10/00 |
| | | | 428/828 |
| 2007/0278547 A1 | 12/2007 | Pietambaram et al. | |
| 2008/0205130 A1 | 8/2008 | Sun et al. | |
| 2008/0247072 A1 | 10/2008 | Nozieres et al. | |
| 2009/0219754 A1* | 9/2009 | Fukumoto | B82Y 25/00 |
| | | | 365/158 |
| 2010/0080050 A1* | 4/2010 | Ozeki | B82Y 25/00 |
| | | | 365/158 |
| 2013/0077390 A1* | 3/2013 | Lombard | G11C 11/1673 |
| | | | 365/158 |
| 2013/0250671 A1* | 9/2013 | Dieny | G11C 11/16 |
| | | | 365/158 |

* cited by examiner

MAGNETIC RANDOM ACCESS MEMORY (MRAM) CELL WITH LOW POWER CONSUMPTION

FIELD

The present invention concerns a magnetic random access memory (MRAM) cell comprising a magnetic tunnel junction containing a synthetic storage layer and having low power consumption. The present invention further concerns a method for writing the same.

BACKGROUND

In the simplest implementation, magnetic random access memory (MRAM) cells comprise at least a magnetic tunnel junction formed of two magnetic layers separated by a thin insulating layer, where one of the layer, the so-called reference layer, is characterized by a fixed magnetization and the second layer, the so-called storage layer, is characterized by a magnetization which direction can be changed upon writing of the memory. When the respective magnetizations of the reference layers and the storage layer are antiparallel, the resistance of the magnetic tunnel junction is high, corresponding to a low logic state "0". On the other hand, when the respective magnetizations are parallel, the resistance of the magnetic tunnel junction becomes low, corresponding to a high logic state "1". The logic state of the MRAM cell is read by comparing its resistance state to a reference resistance, preferably derived from a reference cell or an array of reference cells, with a reference resistance, combined in-between the magnetic tunnel junction resistance of the high logic state "1" and the resistance of the low logic state "0".

In an implementation of the MRAM cell using a thermally assisted switching (TAS) procedure, for example as described in U.S. Pat. No. 6,950,335, the storage layer is also exchange biased to an adjacent antiferromagnetic storage layer having a storage blocking temperature (the temperature at which the exchange bias of the antiferromagnetic storage layer vanishes) is lower than that a reference blocking temperature of an antiferromagnetic reference layer pinning the reference layer. Below the storage blocking temperature, the storage layer is difficult and/or impossible to write. Writing is then performed by heating the magnetic tunnel junction above the storage blocking temperature but below the reference blocking temperature. This is preferably performed by sending a heating current through the magnetic tunnel junction in order to free the magnetization of the storage layer, while simultaneously applying means of switching the magnetization of the storage layer. The latter can be switched by a magnetic field generated by a field current. The magnetic tunnel junction is then cooled down below the storage blocking temperature, where the storage layer magnetization is "frozen" in the written direction.

The magnetic field magnitude required to switch the magnetization direction of the storage layer is proportional to the coercivity of the storage layer. At small feature size, critical diameter distribution, shape variability and roughness of the edge surface of the magnetic tunnel junction lead to an increase of coercive field and an increase of coercive field distribution. Sensitivity to the distribution of dot shape is reduced when reducing the effective magnetization of the storage layer, which can be made by means of a specific kind of storage layer called "Synthetic Antiferromagnet", in which effective magnetization is reduced. However, such reduction of effective magnetization comes at the cost of a higher coercive field.

EP2276034 concerns a magnetic random access memory cell containing a magnetic tunnel junction formed from an insulating layer comprised between a sense layer and a storage layer. The present disclosure also concerns a method for writing and reading the memory cell comprising, during a write operation, switching a magnetization direction of said storage layer to write data to said storage layer and, during a read operation, aligning magnetization direction of said sense layer in a first aligned direction and comparing said write data with said first aligned direction by measuring a first resistance value of said magnetic tunnel junction. The disclosed memory cell and method allow for performing the write and read operations with low power consumption and an increased speed.

US20070278547 discloses an MRAM bit which includes a free magnetic region, a fixed magnetic region comprising an antiferromagnetic material, and a tunneling barrier comprising a dielectric layer positioned between the free magnetic region and the fixed magnetic region. The MRAM bit avoids a pinning layer by comprising a fixed magnetic region exhibiting a well-defined high flop field using a combination of high uniaxial anisotropy, high saturation field, and ideal soft magnetic properties exhibiting well-defined easy and hard axes.

SUMMARY

The present disclosure concerns a MRAM cell comprising a magnetic tunnel junction containing: a storage layer comprising a first ferromagnetic layer having a first storage magnetization, a second ferromagnetic layer having a second storage magnetization which magnitude can differ from the one of the a first storage magnetization, and a spacer layer arranged between the first and second storage layers and magnetically coupling them, such that the first storage magnetization is oriented substantially anti-parallel with the second magnetization; an antiferromagnetic storage layer pinning the first and second storage magnetizations at a low threshold temperature and freeing said first and second storage magnetizations at a high temperature threshold; a reference layer; and a tunnel barrier layer between the reference layer and the storage layer; the magnetic tunnel junction further comprising a free ferromagnetic layer having a free magnetization adapted to induce a magnetic stray field magnetically coupling the free ferromagnetic layer with the storage layer; such that said first and second storage magnetizations can be switched by the magnetic stray field when the magnetic tunnel junction is at the high temperature threshold; wherein the first storage magnetization is configured to have a larger magnitude than the one of the second storage magnetization such that the first storage magnetization is switchable by the magnetic stray field when the magnetic tunnel junction is at the high temperature threshold, or, the second storage magnetization is configured to have a larger magnitude than the first storage magnetization such that the second storage magnetization is switchable by the magnetic stray field when the magnetic tunnel junction is at the high temperature threshold.

In yet another embodiment, the free ferromagnetic layer can be comprised at one end of the magnetic tunnel junction, on the side of the antiferromagnetic storage layer opposed to the storage layer.

In yet another embodiment, the magnetic tunnel junction can further comprise an antiferromagnetic reference storage layer exchange-coupling the reference layer, and wherein the free ferromagnetic layer can be comprised at the other of the end of the magnetic tunnel junction, on the side of the antiferromagnetic reference layer opposed to the reference layer.

In yet another embodiment, the magnetic tunnel junction further comprises a non-magnetic layer between the free ferromagnetic layer and the storage and reference layer such that substantially no magnetic coupling occurs between the free magnetization and the antiferromagnetic storage layer.

In yet another embodiment, the reference layer can comprise a first reference ferromagnetic layer having a first fixed reference magnetization, a second reference ferromagnetic layer having a second fixed reference magnetization, and a reference spacer layer between the first and second ferromagnetic layers and coupling the first reference magnetization antiparallel to the second reference magnetization.

In yet another embodiment, the first and second reference ferromagnetic layers can be arranged such that substantially no stray field is induced between the first and second reference ferromagnetic layers and the free ferromagnetic layer.

The present disclosure further pertains to a method for writing to the MRAM cell comprising heating the magnetic tunnel junction to the high temperature threshold; switching the first and second storage magnetizations in the written state; and cooling the magnetic tunnel junction to the low temperature threshold such as to freeze said first and second storage magnetizations in the written state, wherein switching said first and second storage magnetizations can comprise applying an external magnetic field adapted to align the free magnetization of the free ferromagnetic layer in accordance with the external magnetic field such as to induce the magnetic stray field adapted to switch the first and second storage magnetizations.

The disclosed MRAM cell can be written with a lower magnetic field in comparison with conventional MRAM cells, thus resulting in the MRAM cell having lower power consumption.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
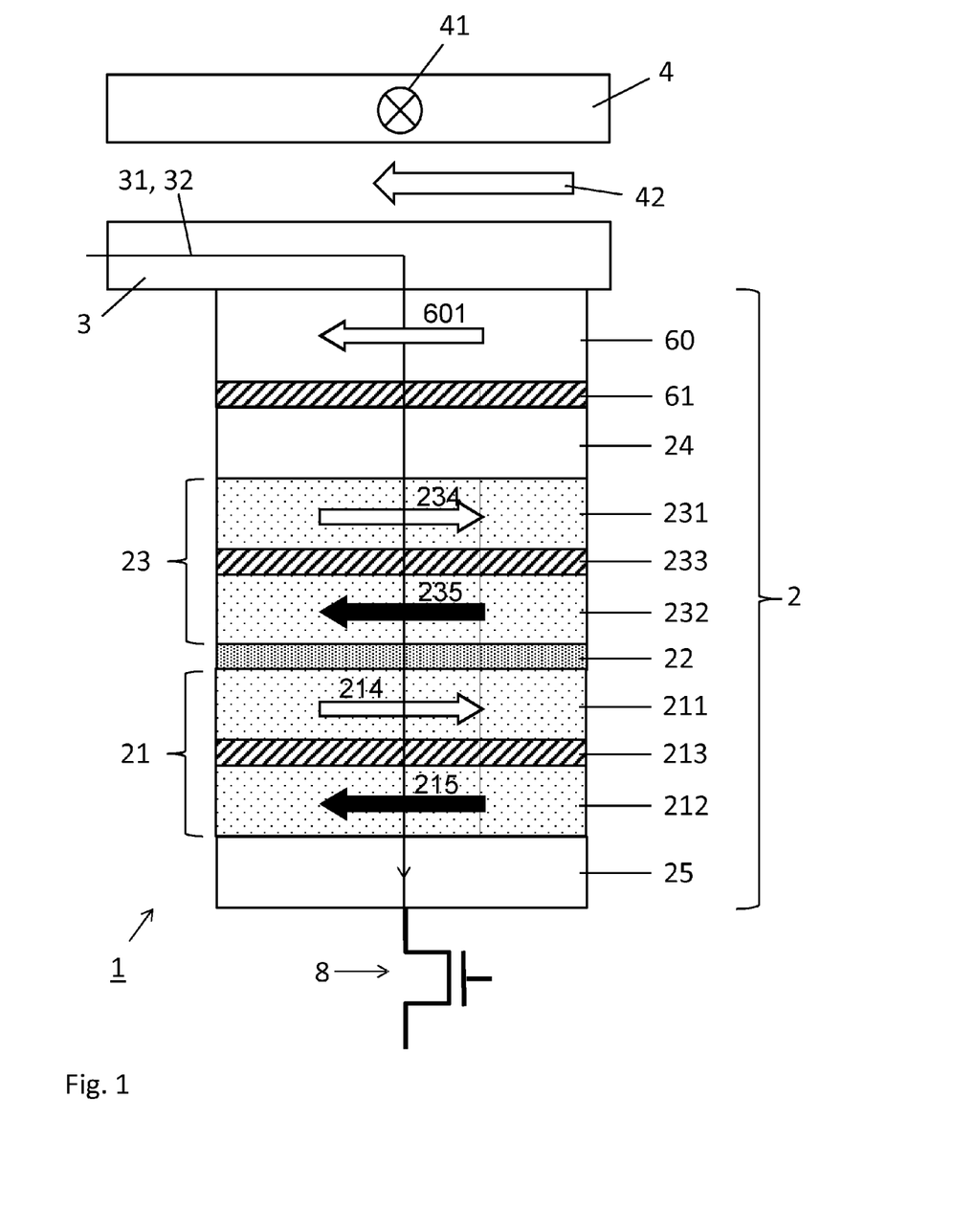
FIG. 1 represents a random access memory (MRAM) cell comprising the synthetic storage layer and a free ferromagnetic layer, according to an embodiment.

In an embodiment illustrated in FIG. 1, a magnetic random access memory (MRAM) cell 1 comprises a magnetic tunnel junction 2. The magnetic tunnel junction 2 comprises a synthetic storage layer 23 formed from a synthetic ferromagnetic multilayer comprising a first storage ferromagnetic layer 231 having a first storage magnetization 234, a second storage ferromagnetic layer 232 having a second storage magnetization 235, the first and second storage ferromagnetic layers 231, 232 being separated by a storage spacer layer 233. In the exemplary configuration of FIG. 1, the synthetic storage layer 23 is exchange coupled with an antiferromagnetic storage layer 24 such as to pin the first storage magnetization 234 of the first storage ferromagnetic layer 231 at a low temperature threshold and to free it at a high temperature threshold.

The magnetic tunnel junction 2 further comprises a reference layer 21 formed from a synthetic ferromagnetic multilayer comprising a first reference ferromagnetic layer 211 having a first reference magnetization 214, a second reference ferromagnetic layer 212 having a second reference magnetization 215, and a reference spacer layer 213 between the first and second ferromagnetic layers 211, 212 and coupling the first reference magnetization 214 antiparallel to the second reference magnetization 215. In the configuration of FIG. 1, the second reference magnetization 215 is pinned by an antiferromagnetic reference storage layer 25 being disposed on the side of the second reference ferromagnetic layer 212. The antiferromagnetic reference storage layer 25 exchange-couples the reference layer 21 such that the first and second reference magnetizations 214, 215 remain pinned at the low and high temperature thresholds.

The storage ferromagnetic layers 231, 232 and the reference ferromagnetic layers 211, 212 can comprise an alloy such as, for example, cobalt iron (CoFe), cobalt iron boron (CoFeB), nickel iron (NiFe), Cobalt (Co), etc. The thickness of the first and second storage ferromagnetic layer 231, 232 and of the first and second reference ferromagnetic layer 211, 212 can be comprised, for example, between 1 nm and 10 nm. The dimensions (e.g., thickness) of the storage spacer layer 233 may be selected to cause the first and second storage ferromagnetic layers 231 and 232 to be magnetically coupled, such that the first storage magnetization 234 is oriented anti-parallel with the second storage magnetization 235. Similarly, the dimensions of the reference spacer layer 213 may be selected to cause the first and second reference ferromagnetic layers 211 and 212 to be magnetically coupled, such that the first storage magnetization 214 is oriented anti-parallel with the second storage magnetization 215. Alternatively, the storage spacer layer 233 could also be selected such that the first storage magnetization 234 is oriented parallel with the second storage magnetization 235.

More particularly, the dimensions of the storage and/or reference spacer layer 233, 213 may depend on the material that the spacer layer 233, 213 is formed from. For example, the storage and/or reference spacer layer 233, 213 can be made from a non-magnetic material selected from the group comprising, for example, ruthenium (Ru), rhenium (Re), rhodium (Rh), tellurium (Te), yttrium (Y), chromium (Cr), iridium (Ir), silver (Ag), copper (Cu), etc. In an embodiment, the storage spacer layer 233 and the reference spacer layer 213 have thickness that is comprised between about 0.2 nm and 3 nm. However, other thicknesses may also be suitable to couple the two ferromagnetic layers 231, 232 and 211, 212, respectively. The antiferromagnetic storage and reference layers 24, 25 can be made from a manganese-based alloy, such as IrMn, PtMn or FeMn, or any other suitable materials.

The magnetic tunnel junction 2 further comprises a free ferromagnetic layer 60. The free ferromagnetic layer 60 has a free magnetization 601 that can be freely aligned. When patterned into magnetic tunnel junctions, ferromagnetic layers 211, 212, 231, 232 of the magnetic tunnel junction 2 exhibit dipolar stray fields (not shown). In particular, the sum of the stray fields induced by first and second storage layer 231 and 232 results in a net storage magnetic stray field (also not shown) and the free ferromagnetic layer 60 itself induces a free magnetic stray field 55 (shown in FIGS. 2 and 3 by numeral 55). The net storage magnetic stray field and the free magnetic stray field 55 result in a local magnetic coupling between the magnetization 601 and the net storage magnetization resulting from the first and second storage magnetization 234, 235. The magnitude of this local magnetic coupling depend on the magnitude of stray fields from magnetic layers 231, 232 and 60.

The magnitude of the stray fields from the first and second storage layer 231 and 232 depends on the first and second storage magnetization 234 and 235. In turn, the first storage magnetization 234 can be varied by varying the thickness of the first ferromagnetic layer 231, and the second storage magnetization 235 can be varied by varying the thickness of the second ferromagnetic layer 232. Similarly the magnitude of the free magnetic stray field 55 depends on the free layer magnetization 601 that can be varied by varying the thickness of the free ferromagnetic layer 60. For example, the thickness of the free ferromagnetic layer 60 can be comprised, without being limited to, between 1 nm and 10 nm. The magnetizations 234, 235 and 601 can also be varied, for example, by selecting magnetic materials having various spontaneous magnetizations such as, but not exclusively, Fe, Co, Ni and their alloys such as FeCo, NiFe, FeCoB, FeCoNi or FeCoCr.

In an embodiment, the synthetic reference layer 21 is arranged such as to induce substantially no magnetic coupling with the storage layer 23 and free ferromagnetic layer 60. This can be achieved, for example, by selecting a thickness of the first reference ferromagnetic layer 211 and of the second reference ferromagnetic layer 212 such that the sum of the magnetic stray fields induced by first and second reference ferromagnetic layer 211, 212 is substantially null. This can be achieved, alternatively or in addition, by an appropriate selection of magnetic materials comprised in the first and second reference magnetization 214, 215.

According to an embodiment, a thermally assisted switching (TAS) write operation of the MRAM cell 1 comprises:

heating the magnetic tunnel junction 2 to a high temperature threshold;

once the magnetic tunnel junction 2 has reached the high temperature threshold, switching the first and second storage magnetizations 234, 235 in the written state (write data); and cooling the magnetic tunnel junction 2 to the low temperature threshold such as to freeze the first and second storage magnetizations 234, 235 in the written state.

Figure 2:
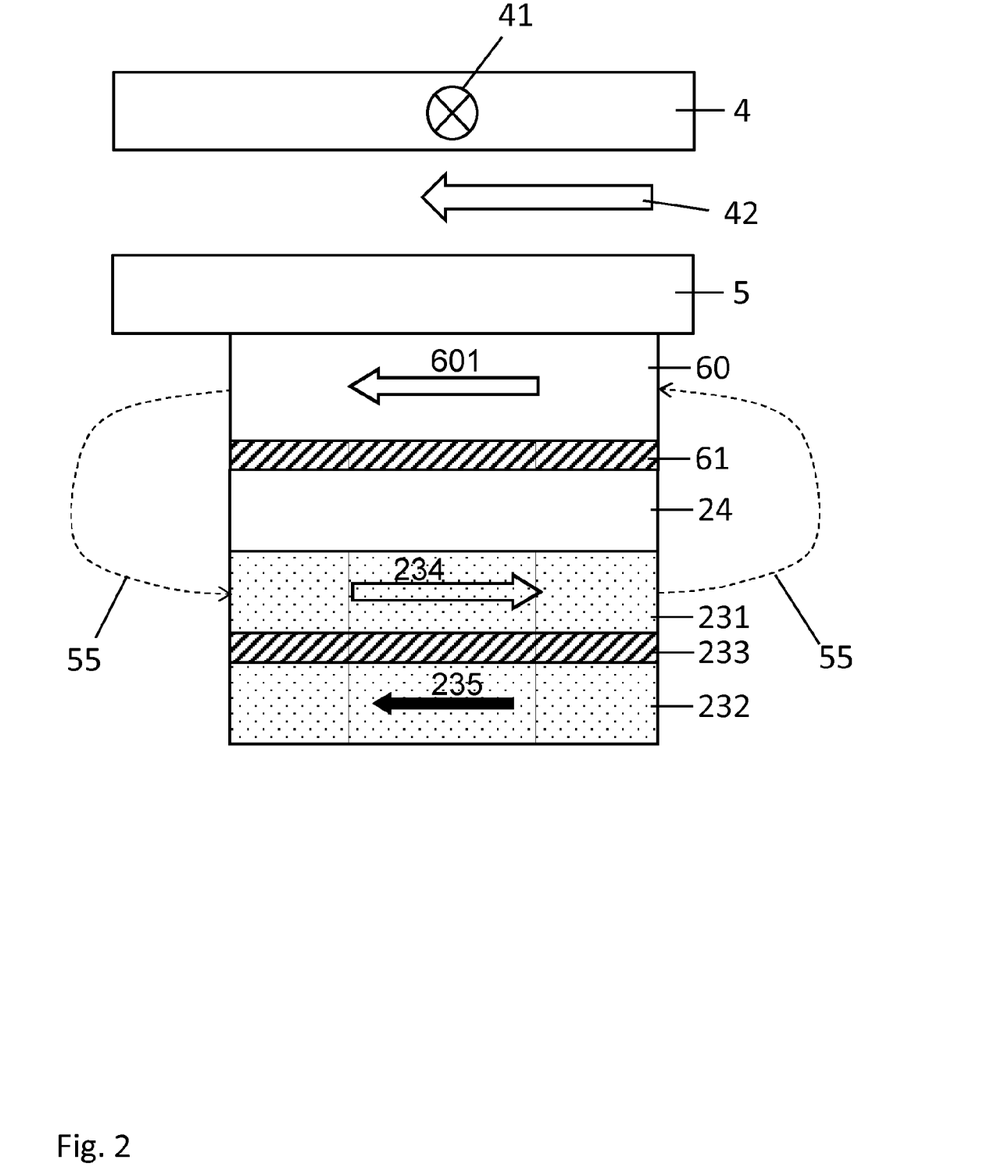
FIG. 2 represents the MRAM cell comprising the synthetic storage layer and a free ferromagnetic layer, according to another embodiment.
Figure 3:
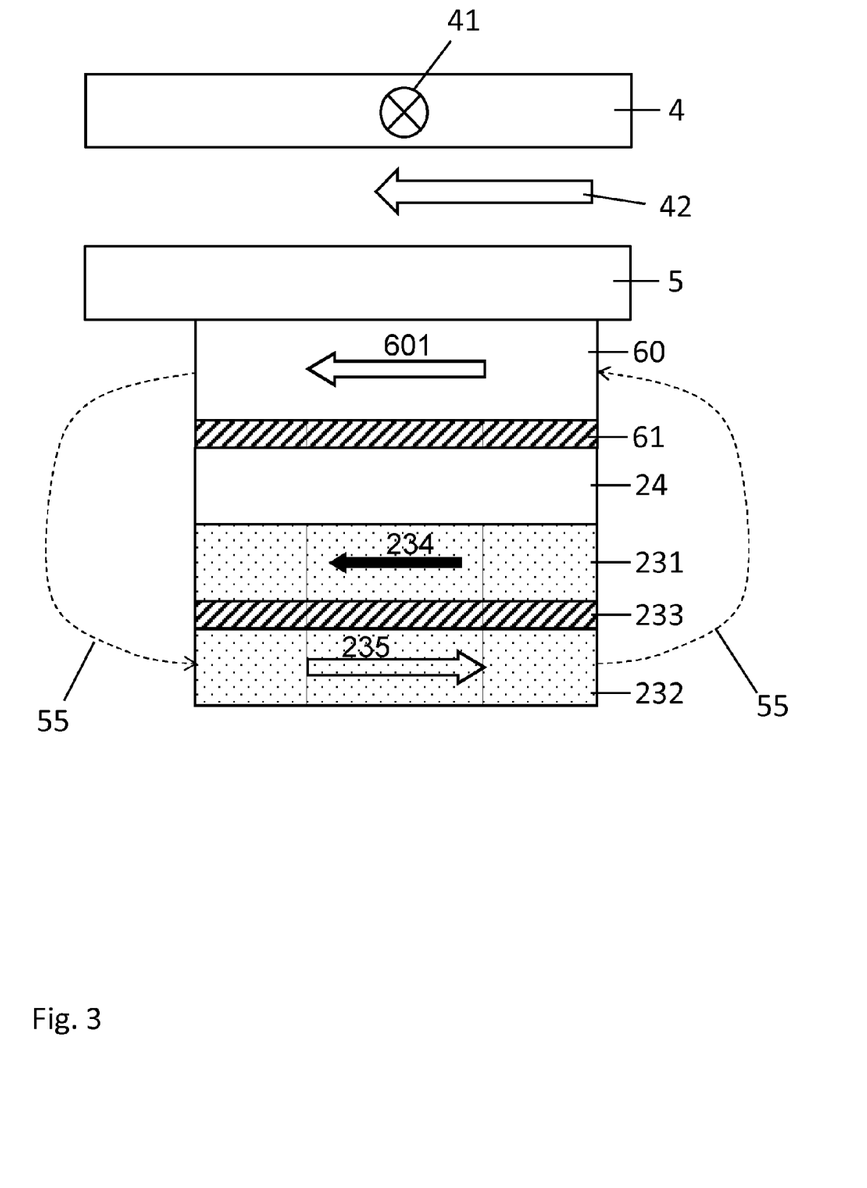
FIG. 3 shows the MRAM cell comprising the synthetic storage layer and a free ferromagnetic layer, according to yet another embodiment.

Heating the magnetic tunnel junction 2 can comprise passing a heating current 31 in the magnetic tunnel junction 2 via a current line 5 in electrical contact with one end of the magnetic tunnel junction 2. More particularly, the heating current 31 can be passed in the magnetic tunnel junction 2 by setting a selection transistor 8, electrically connected to the other end of the magnetic tunnel junction 2, in the passing mode. The magnetic tunnel junction 2 is heated to the high temperature threshold, at which the first storage magnetization 234 is no more pinned and can be freely aligned. Switching the first and second storage magnetizations 234, 235 can comprise applying an external write magnetic field 42. In the example of FIGS. 1 to 3, applying the write magnetic field 42 is achieved by passing a field current 41 in a field line 4. Cooling the magnetic tunnel junction 2 can be performed by inhibiting the heating current 31. The write magnetic field 42 can be maintained during the cooling of the magnetic tunnel junction 2 and switched off once the magnetic tunnel junction 2 has reached a low temperature threshold.

FIG. 2 represents the MRAM cell 1 according to an embodiment, where only a portion of the magnetic tunnel junction 2 is shown including the free ferromagnetic layer 60, the antiferromagnetic storage layer 24 and the synthetic storage layer 23. In particular, in the example of FIG. 2 the first storage magnetization 234 is shown having a larger magnitude than the one of the second storage magnetization 235. The higher magnitude of the first storage magnetization 234 can be achieved, for example, by the first ferromagnetic layer 231 having a greater thickness than the second ferromagnetic layer 232.

Switching the first and second storage magnetizations 234, 235 comprises passing a write current 41 in a field line 4 such as to generate an external magnetic field 42 adapted to align (possibly saturate) the free magnetization 601 of the free ferromagnetic layer 60 in the direction of the external magnetic field 42. The aligned free ferromagnetic layer 60 induces in turn a magnetic stray field 55 coupling the free magnetization 601 with the first and/or second storage magnetizations 234, 235 in a closed magnetic flux configuration. In the particular example of FIG. 2, the first storage magnetization 234 is larger than the second storage magnetization 235, so that the net storage magnetic stray field has the same direction than the first magnetization 234 and the magnetic stray field 55 couples the free magnetization 601 with the net storage magnetization. The first storage magnetization 234 is thus switched in accordance with the magnetic stray field 55, i.e., in a direction being opposed to the one of the external magnetic field 42. Due to the magnetic coupling between the first and second storage ferromagnetic layers 231 and 232, the second storage magnetization 235 will be switched anti-parallel to the first storage magnetization 234.

FIG. 3 represents the MRAM cell 1 according to another embodiment, where the second storage magnetization 235 has a larger magnitude than the one of the first storage magnetization 234. The higher magnitude of the second storage magnetization 235 can be achieved, for example, by the second ferromagnetic layer 232 having a greater thickness than the first ferromagnetic layer 231. In this configuration, the net storage magnetization has the same direction than second magnetization 235, and the aligned free ferromagnetic layer 60 will induce the magnetic stray field 55, coupling the free magnetization 601 with the net storage magnetization. The second storage magnetization 235 is thus switched in accordance with the magnetic stray field 55, i.e., in a direction being opposed to the one of the external magnetic field 42. Due to the magnetic coupling between the first and second storage ferromagnetic layers 231 and 232, the first storage magnetization 234 will be switched anti-parallel to the second storage magnetization 235.

The magnitude of the external magnetic field 42 required for switching the first and second storage magnetizations 234, 235 via the magnetic stray field 55 can be much smaller than its magnitude when the storage magnetizations 234, 235 is switched directly with the external magnetic field 42. Indeed, the free magnetization 601 can be switched with a smaller external magnetic field 42 than the first and second storage magnetizations 234, 235. Moreover, the magnetic stray field 55 induced between the aligned free magnetization 601 and first and second storage magnetizations 234, 235 is larger than the applied external magnetic field 42, due to the small distance between the free ferromagnetic layer 60 and the first and second ferromagnetic layers 231, 232, typically in the nanometer range. For example, the magnitude of the write magnetic field 42 required to saturate the sense magnetization 211 can be below about 80 Oe. The induced magnetic stray field 55, in turn, can be larger than about 200 Oe.

Figure 5:
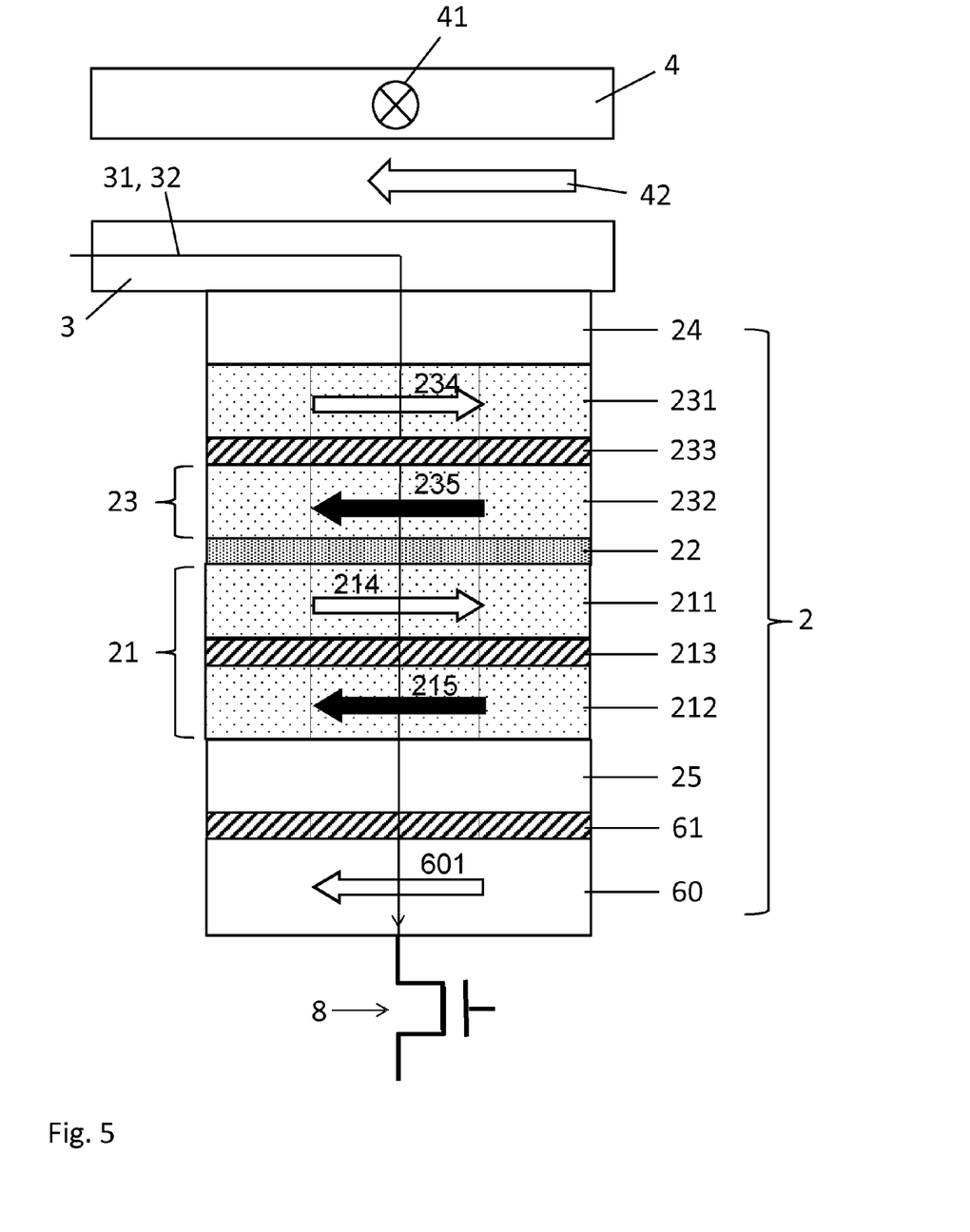
FIG. 5 represents the MRAM cell, according to yet another embodiment.

The free ferromagnetic layer 60 is preferably comprised at one of the end of the magnetic tunnel junction 2. In the examples of FIGS. 1 to 3, the free ferromagnetic layer 60 is located such that the antiferromagnetic storage layer 24 is between the free ferromagnetic layer 60 and the storage layer 23. Alternatively, the free ferromagnetic layer 60 can also be comprised such that the antiferromagnetic reference layer 25 is between the free ferromagnetic layer 60 and the reference layer 21 (see FIG. 5).

In an embodiment, a read operation comprises passing selectively a read current 32 in the magnetic tunnel junction 2 of the written MRAM cell 1 and measuring a cell resistance $R_C$ of the MRAM cell 1. The read current 32 can be passed in the magnetic tunnel junction 2 when the selection transistor 8 is in the passing mode. In the arrangement of the magnetic tunnel junction 2 shown in FIGS. 1 to 3, the cell resistance $R_C$ is determined by the relative orientation of the second storage magnetization 235 with the first reference magnetization 214. A high cell resistance $R_C$ is measured when the second storage magnetization 235 is substantially antiparallel to the first reference magnetization 214, and a low cell resistance $R_C$ is measured when the second storage magnetization 235 is substantially parallel to the first reference magnetization 214.

In an embodiment, the magnetic tunnel junction 2 further comprises a non-magnetic material layer represented by numeral 61 in FIGS. 1 to 3. For example, the non-magnetic layer 61 can comprise one of Ru, Ta, Cu or an alloy of these elements. A role of the non-magnetic layer 61 is to prevent a magnetic coupling between the free ferromagnetic layer 60 and the antiferromagnetic storage layer 24. The non-magnetic layer 61 is disposed between the free ferromagnetic layer 60 and the storage and reference layer 23, 21. In the particular examples of FIGS. 1 to 3, the non-magnetic layer 61 is disposed between the free ferromagnetic layer 60 and the antiferromagnetic storage layer 24. In another possible configuration shown in FIG. 5, for example where the free ferromagnetic layer 60 is disposed on the side of the antiferromagnetic reference layer 25, the non-magnetic layer 61 can be disposed between the free ferromagnetic layer 60 and the antiferromagnetic reference layer 25. In this latter configuration, the non-magnetic layer 61 prevents the magnetic coupling between the free ferromagnetic layer 60 and the antiferromagnetic reference layer 25 and avoids that the free magnetization 601 becomes pinned by the antiferromagnetic reference layer 25.

Figure 4:
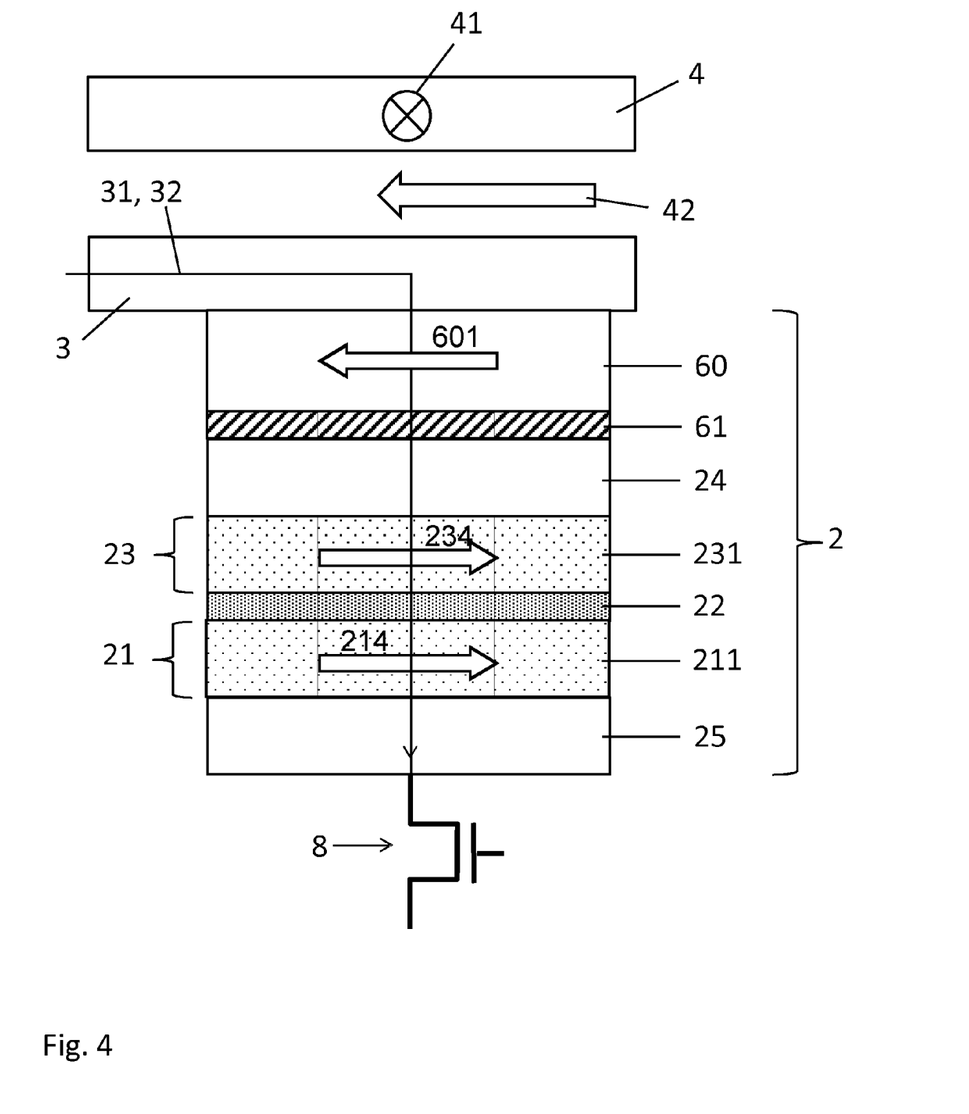
FIG. 4 represents the MRAM cell, according to another embodiment.

In another embodiment illustrated in FIG. 4, the storage layer 23 comprises only the first storage ferromagnetic layer 231 having the first storage magnetization 234. The first storage ferromagnetic layer 231 is exchange-coupled with the antiferromagnetic storage layer 24 such as to pin the first storage magnetization 234 at a low temperature threshold and to free it at a high temperature threshold. Moreover, a local magnetic coupling between the free magnetization 601 and the first storage magnetization 234 results from a stray field originating from the first storage layer 231 and from the free magnetic stray field 55. The magnitude of the local magnetic coupling depends on the magnitude of the stray field originating from the first storage layer 231 and of the free magnetic stray field 55. In this configuration, the first storage magnetization 234 is switchable by the magnetic stray field 55 when the magnetic tunnel junction 2 is at the high temperature threshold.

During the TAS write operation, once the magnetic tunnel junction 2 has reached the high temperature threshold, the first storage magnetization 234 can be switched in the written state, and the magnetic tunnel junction 2 can be cooled to the low temperature threshold such as to freeze the first storage magnetizations 234 in the written state. When switching the first storage magnetization 234, the aligned free ferromagnetic layer 60 is such as to induce the magnetic stray field 55 coupling the free magnetization 601 with the first storage magnetization 234 in a closed magnetic flux configuration. The first storage magnetization 234 is thus switched in accordance with the magnetic stray field 55, i.e., in a direction being opposed to the one of the external magnetic field 42. During the read operation, the cell resistance $R_C$ is determined by the relative orientation of the first storage magnetization 234 with the first reference magnetization 214.

A magnetic memory device (not shown) can be formed by assembling an array comprising a plurality of the MRAM cell 1. The array of MRAM cells 1 can be disposed within a device package (also not shown). When forming the magnetic memory device, the magnetic tunnel junction 2 of each MRAM cell 1 can be connected on the side of the storage layer 23 to the current line 3 and on the opposite side to a word line (not shown). The word line is preferably placed perpendicularly with reference to the current line 3.

REFERENCE NUMBERS 1 magnetic random access memory (MRAM) cell
2 magnetic tunnel junction
21 sense layer
211 first reference ferromagnetic layer
212 second reference ferromagnetic layer
213 reference spacer layer
214 first reference magnetization
215 second reference magnetization
22 tunnel barrier layer
23 synthetic storage layer
231 first storage ferromagnetic layer
232 second storage ferromagnetic layer
233 storage spacer layer
234 first storage magnetization
235 second storage magnetization
24 antiferromagnetic storage layer
25 antiferromagnetic reference layer
3 current line
31 heating current
32 sense current
4 field line
41 write current
42 external magnetic field
55 magnetic stray field
60 free ferromagnetic layer
61 non-magnetic layer
601 free magnetization
8 transistor
$R_C$ cell resistance

The invention claimed is:
1. A magnetic random access memory (MRAM) cell comprising a magnetic tunnel junction containing:
   a storage layer comprising a first ferromagnetic layer having a first storage magnetization, a second ferromagnetic layer having a second storage magnetization which has a magnitude which differs from the magnitude of the a first storage magnetization; and a spacer layer arranged between the first and second storage layers and magnetically coupling them, such that the first storage magnetization is oriented substantially anti-parallel with the second storage magnetization;

an antiferromagnetic storage layer pinning the first and second storage magnetizations at a low threshold temperature and freeing said first and second storage magnetizations at a high temperature threshold;

a reference layer; and a tunnel barrier layer between the reference layer and the storage layer;

the magnetic tunnel junction further comprising a free ferromagnetic layer having a free magnetization adapted to induce a magnetic stray field magnetically coupling the free ferromagnetic layer with the storage layer; such that said first and second storage magnetizations are switchable by the magnetic stray field when the magnetic tunnel junction is at the high temperature threshold;

the first storage magnetization being configured to have a larger magnitude than the magnitude of the second storage magnetization such that the first storage magnetization is switchable by the magnetic stray field when the magnetic tunnel junction is at the high temperature threshold; or the second storage magnetization being configured to have a larger magnitude than the first storage magnetization such that the second storage magnetization is switchable by the magnetic stray field when the magnetic tunnel junction is at the high temperature threshold, wherein the magnetic tunnel junction further comprises an antiferromagnetic reference layer exchange-coupling the reference layer, and wherein the free ferromagnetic layer is comprised at one end of the magnetic tunnel junction such that the antiferromagnetic reference layer is between the free ferromagnetic layer and the reference layer.

2. The MRAM cell according to claim 1, wherein the free ferromagnetic layer is comprised at one end of the magnetic tunnel junction such that the antiferromagnetic storage layer is between the free ferromagnetic layer and the storage layer.

3. The MRAM cell according to claim 1, wherein the magnetic tunnel junction further comprises a non-magnetic layer between the free ferromagnetic layer and the storage and reference layers.

4. The MRAM cell according to claim 3, wherein the non-magnetic layer is comprised between the free ferromagnetic layer and the antiferromagnetic storage layer such that substantially no magnetic coupling occurs between the free ferromagnetic layer and the antiferromagnetic storage layer.

5. The MRAM cell according to claim 3, wherein the non-magnetic layer is comprised between the free ferromagnetic layer and the antiferromagnetic reference layer such that substantially no magnetic coupling occurs between the free ferromagnetic layer and the antiferromagnetic reference layer.

6. The MRAM cell according to claim 1, wherein the reference layer comprises a first reference ferromagnetic layer having a first fixed reference magnetization, a second reference ferromagnetic layer having a second fixed reference magnetization, and a reference spacer layer between the first and second ferromagnetic layers and coupling the first reference magnetization antiparallel to the second reference magnetization.

7. The MRAM cell according to claim 6, wherein the first and second reference ferromagnetic layers are arranged such that substantially no stray field is induced between the first and second reference ferromagnetic layers and the free ferromagnetic layer.

8. A method for writing to the MRAM cell a magnetic tunnel junction containing a storage layer comprising a first ferromagnetic layer having a first storage magnetization, a second ferromagnetic layer having a second storage magnetization which has a magnitude which differs from the one of the a first storage magnetization; and a spacer layer arranged between the first and second storage layers and magnetically coupling them, such that the first storage magnetization is oriented substantially anti-parallel with the second storage magnetization; an antiferromagnetic storage layer pinning the first and second storage magnetizations at a low threshold temperature and freeing said first and second storage magnetizations at a high temperature threshold; a reference layer; a tunnel barrier layer between the reference layer and the storage layer; a free ferromagnetic layer having a free magnetization adapted to induce a magnetic stray field magnetically coupling the free ferromagnetic layer with the storage layer; such that said first and second storage magnetizations are switchable by the magnetic stray field when the magnetic tunnel junction is at the high temperature threshold; the first storage magnetization being configured to have a larger magnitude than the magnitude of the second storage magnetization such that the first storage magnetization is switchable by the magnetic stray field when the magnetic tunnel junction is at the high temperature threshold; or the second storage magnetization being configured to have a larger magnitude than the first storage magnetization such that the second storage magnetization is switchable by the magnetic stray field when the magnetic tunnel junction is at the high temperature threshold, wherein the magnetic tunnel junction further comprises an antiferromagnetic reference layer exchange-coupling the reference layer, and wherein the free ferromagnetic layer is comprised at one end of the magnetic tunnel junction such that the antiferromagnetic reference layer is between the free ferromagnetic layer and the reference layer;

the method comprising:

heating the magnetic tunnel junction to the high temperature threshold;

switching the first and second storage magnetizations in the written state; and cooling the magnetic tunnel junction to the low temperature threshold such as to freeze the first and second storage magnetizations in the written state characterized in that switching the first and second storage magnetizations comprises applying an external magnetic field adapted to align the free magnetization of the free ferromagnetic layer in accordance with the external magnetic field such as to induce the magnetic stray field adapted to switch the first and second storage magnetizations.

9. The method according to claim 8, wherein the magnitude of the first storage magnetization is larger than the magnitude of the second storage magnetization and the first storage magnetization is switched by the magnetic stray field; or the magnitude of the second storage magnetization is larger than the magnitude of the first storage magnetization and the second storage magnetization is switched by the magnetic stray field.

10. A magnetic memory device comprising a plurality of the MRAM cell according to claim 1.

11. A magnetic random access memory (MRAM) cell comprising a magnetic tunnel junction containing:
- a storage layer comprising a first ferromagnetic layer having a first storage magnetization, a second ferromagnetic layer having a second storage magnetization which has a magnitude which differs from the magnitude of the a first storage magnetization; and a spacer layer arranged between the first and second storage layers and magnetically coupling them, such that the first storage magnetization is oriented substantially anti-parallel with the second storage magnetization;
- an antiferromagnetic storage layer having a high temperature threshold and a low temperature threshold, the low temperature threshold being a temperature at which the antiferromagnetic storage layer pins the first and second storage magnetizations and the high temperature threshold being a temperature at which the antiferromagnetic storage layer frees said first and second storage magnetizations;
- a reference layer; and
- a tunnel barrier layer between the reference layer and the storage layer;
- the magnetic tunnel junction further comprising a free ferromagnetic layer having a free magnetization adapted to induce a magnetic stray field, the magnetic stray field and a net storage magnetization resulting from the first and second storage magnetization resulting in a magnetic coupling between the free ferromagnetic layer and the storage layer such that said first and second storage magnetizations are switchable by the magnetic stray field when the magnetic tunnel junction is at the high temperature threshold,
- wherein the first storage magnetization has a larger magnitude than the magnitude of the second storage magnetization such that the first storage magnetization is switched by the magnetic stray field when the magnetic tunnel junction is at the high temperature threshold, or, the second storage magnetization has a larger magnitude than the first storage magnetization such that the second storage magnetization is switched by the magnetic stray field when the magnetic tunnel junction is at the high temperature threshold.

\* \* \* \* \*

UNITED STATES PATENT AND TRADEMARK OFFICE
CERTIFICATE OF CORRECTION

PATENT NO. : 9,679,624 B2  
APPLICATION NO. : 14/647600  
DATED : June 13, 2017  
INVENTOR(S) : Lombard et al.

Page 1 of 1

It is certified that error appears in the above-identified patent and that said Letters Patent is hereby corrected as shown below:

On the Title Page

Please add the Foreign Application Priority data under item (30), as follows:  
(30) Foreign Application Priority Data  
Nov. 27, 2012 (EP) .......................... 12290413.9

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*